United States Patent
Nobbe et al.

(10) Patent No.: US 9,276,526 B2
(45) Date of Patent: Mar. 1, 2016

(54) AMPLIFIER WITH VARIABLE FEEDBACK IMPEDANCE

(71) Applicant: PEREGRINE SEMICONDUCTOR CORPORATION, San Diego, CA (US)

(72) Inventors: Dan William Nobbe, Crystal Lake, IL (US); Jianhua Lu, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 76 days.

(21) Appl. No.: 14/040,444

(22) Filed: Sep. 27, 2013

(65) Prior Publication Data

US 2015/0091650 A1    Apr. 2, 2015

(51) Int. Cl.
| | |
|---|---|
| *H03G 3/20* | (2006.01) |
| *H03F 1/22* | (2006.01) |
| *H03F 1/32* | (2006.01) |
| *H03F 1/34* | (2006.01) |
| *H03F 3/195* | (2006.01) |

(52) U.S. Cl.
CPC .............. *H03F 1/223* (2013.01); *H03F 1/3205* (2013.01); *H03F 1/342* (2013.01); *H03F 3/195* (2013.01); *H03F 2200/451* (2013.01)

(58) Field of Classification Search
CPC ............... H03C 3/20; H03G 3/12; H03G 3/18
USPC ..................................................... 330/282, 86
See application file for complete search history.

(56) References Cited

U.S. PATENT DOCUMENTS

| | | | | |
|---|---|---|---|---|
| 4,855,685 | A * | 8/1989 | Hochschild | 330/282 |
| 5,285,169 | A * | 2/1994 | Theus | 330/254 |
| 5,327,098 | A * | 7/1994 | Molina et al. | 330/254 |
| 6,919,761 | B2 * | 7/2005 | Cho et al. | 330/51 |
| 7,248,120 | B2 | 7/2007 | Burgener et al. | |
| 7,910,993 | B2 | 3/2011 | Brindle et al. | |
| 7,915,955 | B2 * | 3/2011 | Lin | 330/282 |
| 8,129,787 | B2 | 3/2012 | Brindle et al. | |
| 8,487,706 | B2 | 7/2013 | Li et al. | |
| 8,797,104 | B2 * | 8/2014 | Hsieh et al. | 330/307 |
| 2008/0232822 | A1 * | 9/2008 | Furudate et al. | 398/202 |
| 2013/0222075 | A1 | 8/2013 | Reedy et al. | |
| 2013/0307453 | A1 * | 11/2013 | Sugie | 318/400.32 |

FOREIGN PATENT DOCUMENTS

WO    2009108391    9/2009

OTHER PUBLICATIONS

Sansen, Willy, "Distortion in Elementary Transistor Circuits", IEEE Transactions on Circuits and Systems—II: Analog and Digital Signal Processing, vol. 40, No. 3, Mar. 1999, pp. 315-325.
Rodwell, et al., "33-GHz Monolithic Cascode AlInAs/GaInAs Heterojunction Bipolar Transistor Feedback Amplifier", IEEE Journal of Solid-State Circuits, vol. 26, No. 10, Oct. 1991, pp. 1378-1382.

* cited by examiner

*Primary Examiner* — Henry Choe
(74) *Attorney, Agent, or Firm* — Jaquez Land Richman LLP; Martin J. Jaquez, Esq.; Alessandro Steinfl, Esq.

(57) ABSTRACT

A variable feedback impedance is presented capable of providing high linearity (e.g. as represented by IP2 and IP3) and high linear range (e.g. as represented by P1dB) when used in a feedback path of an RF amplifier in the presence of high voltage amplitudes.

22 Claims, 8 Drawing Sheets

AMPLIFIER WITH VARIABLE FEEDBACK IMPEDANCE

BACKGROUND

1. Field

The present teachings relate to radio-frequency (RF) amplifiers used in RF circuits. More particularly, the present teachings relate to methods and systems for RF amplifiers with variable feedback impedance capable of high output power and high output voltage swings while maintaining high output linearity and high output linear range.

2. Description of Related Art

RF amplifiers are an important part of present days RF communication systems as they constitute the main system block that drives the antenna in any radio transmitter. As such, linearity and power efficiency (e.g. gain) of such amplifiers are sought after attributes for integrators of such devices. Unfortunately these two sought after attributes work against each other as amplifier output tends to become non-linear when operated at higher gains required for better power efficiency. Feedback (e.g. using a combination of resistors, capacitors and inductors) is one of the methods universally known in the art used to trade off amplifier gain for linearity.

As used in the present disclosure, the term "IC" can refer to an integrated circuit or monolithic integrated circuit composed of a set of electronic circuits on one small plate ("chip") of semiconductor material such as silicon. An IC can also be referred to as a "chip" or a "microchip". The set of electronic circuits within an IC are typically made of a very large number of transistors and other electronic components, which may need supply power (e.g. positive supply and negative supply) to operate.

SUMMARY

According to a first aspect of the present disclosure, a radio frequency (RF) amplifier arrangement is provided, the arrangement comprising: an RF amplifier; one or more resistive and/or reactive components within a feedback path between an output terminal and an input terminal of the amplifier; and one or more stacked transistor switches within the feedback path configured to select an impedance value of the feedback path from a plurality of selectable impedance values.

According to a second aspect of the present disclosure, a method for reducing the effect of a variable impedance in a feedback path of a radio frequency (RF) amplifier is provided, the method comprising: providing an RF amplifier with a characteristic output voltage range; providing one or more resistive and/or reactive components; providing one or more stacked transistor switches; operatively connecting the one or more components and the one or more stacked transistor switches; based on the connecting, obtaining a variable impedance with an impedance value of the variable impedance selectable via the one or more stacked transistor switches; operatively coupling the variable impedance between an output terminal of the RF amplifier and an input terminal of the RF amplifier; based on the coupling, creating a feedback path comprising the variable impedance around the RF amplifier; and based on the creating, maintaining the characteristic output voltage range of the RF amplifier.

BRIEF DESCRIPTION OF THE DRAWINGS

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

Amplifier circuits typically exhibit nonlinearities in their response which can be considered as a major nonideality, since such nonlinearities can distort asignal going through the amplifier. In particular, when considering RF applications where RF signals with sophisticated modulation schemes are transmitted, any distortion in the transmitted signal may render decoding of the received signal difficult if not impossible. For this reason, minimizing nonlinearities has been a major design issue for most RF design engineers.

Figure 1:
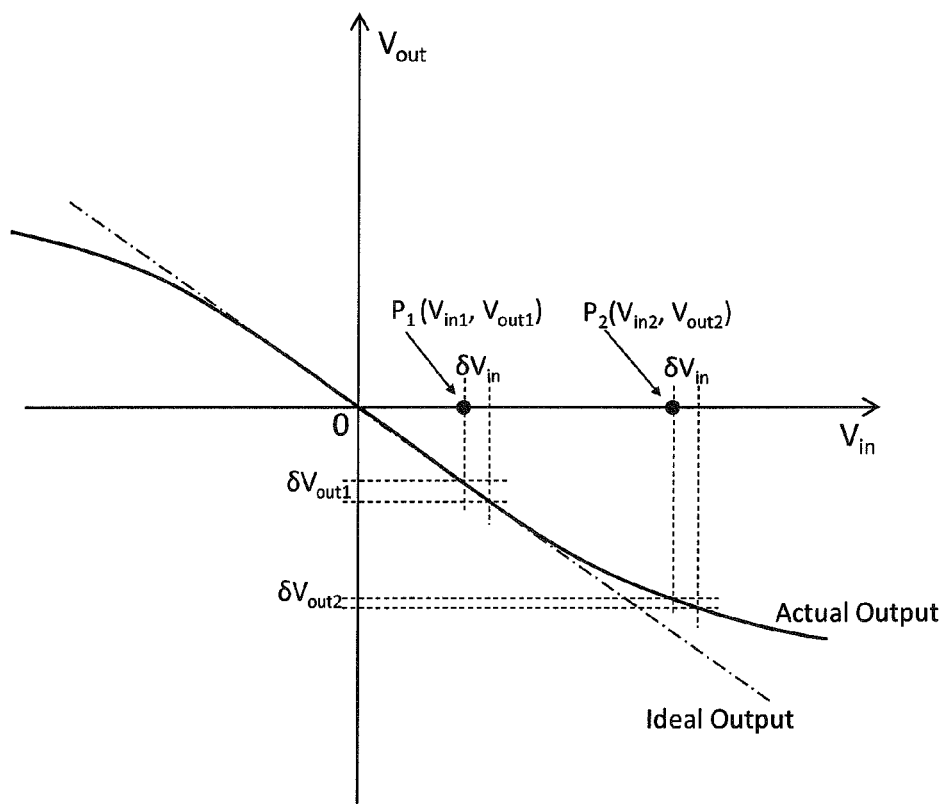
FIG. 1 shows a characteristic input versus output voltage response of an amplifier, wherein the actual output voltage exhibits nonlinearities at higher output voltage levels.

FIG. 1 shows a characteristic response of a nonlinear amplifier. The input voltage ($V_{in}$) fed to an input terminal of the nonlinear amplifier generates an output voltage ($V_{out}$) at an output terminal of the amplifier. This input/output relationship is graphed in FIG. 1 and labeled as the "actual output". In FIG. 1, the actual output of the nonlinear amplifier is contrasted to the "ideal output" of an equivalent linear amplifier, that is, the input/output relationship of the amplifier if the elements contributing to its nonlinear response were removed. As shown in FIG. 1, the actual output of the nonlinear amplifier follows the ideal output at lower output voltage levels, and as the output (absolute) voltage level increases, the actual output deviates from the ideal output due to the nonlinear response of the actual amplifier.

As depicted by the graphs of FIG. 1, nonlinearity of the amplifier can be considered as a variation of the slope (e.g. gain) of the input/output characteristic response as a function of the operating point of the amplifier. For example, considering an operating point ($P_1$) defined by a corresponding ($V_{in1}$, $V_{out1}$) coordinates in the actual output graph of FIG. 1. For an incremental increase ($\delta V_{in}$) of the input voltage around the operating point ($P_1$), a corresponding increase of the output voltage ($\delta V_{out1}$) is observed, such as the slope at the operating point ($P_1$) is the ratio ($\delta V_{out1}/\delta V_{in}$). Similarly, considering an operating point ($P_2$) defined by coordinates ($V_{in2}$, $V_{out2}$) in the actual output graph of FIG. 1, wherein ($V_{in2}$) is larger than ($V_{in1}$). For a same incremental increase ($\delta V_{in}$) of the input voltage around the operating point ($P_2$), a corresponding increase of the output voltage ($\delta V_{out2}$) is observed, such as the slope at the operating point ($P_2$) is the ratio ($\delta V_{out2}/\delta V_{in}$). The difference between the slopes corresponding to a same input variation ($\delta V_{in}$) around the operating points ($P_1$, $P_2$) is due to the nonlinear nature of the amplifier. In the case of an ideal linear system, represented by the ideal output graph of FIG. 1, there would be no difference in slope considering any two operating points on the ideal output graph.

As depicted by the graph of FIG. 1, the response of the nonlinear amplifier tends to flatten as the output voltage increases, thus representing a reduction in voltage gain of the nonlinear amplifier. This trend usually continues till the amplifier reaches a saturation point, beyond which point the output voltage of the nonlinear amplifier saturates and a zero incremental gain is obtained (e.g. zero $\delta V_{out}$ for any $\delta V_{in}$ at operating points beyond saturation).

The difference in output voltage between the actual output and the ideal output as represented in FIG. 1 can be considered as a measure of the nonlinearity of the amplifier. As output voltage increases, nonlinearity also increases. The person skilled in the art of RF circuit design will know that for increased power efficiency it is desirable to run the amplifier at high output voltage (e.g. high gain), such as to minimize any loss of power due to the output biasing of the amplifier. This desired operating mode thus pushes the amplifier in the highly nonlinear region of operation.

A proposed solution to the problem highlighted above is the usage of a negative feedback around the amplifier, as it is well known in the art that such feedback reduces nonlinearities associated with the amplifier as well as stabilizes the amplifier response by reducing variations in the gain of the amplifier. In other words, feedback reduces distortion and widens the linear region of operation of the amplifier.

Figure 2A:
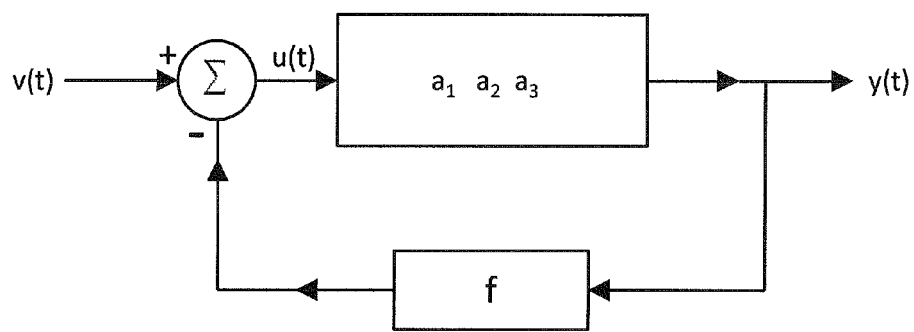
FIG. 2A shows a block diagram of a negative feedback around a nonlinear amplifier characterized by its power series coefficients ($a_i$).

FIG. 2A shows a feedback path, characterized by its transfer function ($f$), applied around a nonlinear amplifier characterized by its power series coefficients ($a_1$, $a_2$, $a_3$), wherein ($a_1$) is the coefficient of an equivalent linear amplifier (e.g. linear gain of the amplifier), and the higher order coefficients ($a_2$, $a_3$) correspond to the higher order (intermodulation) distortion due to the nonlinear nature of the amplifier.

According to FIG. 2A, a time varying signal y(t) at the output of the amplifier feedback arrangement, which comprises the nonlinear amplifier and the feedback path, is fed to the feedback path with the resulting signal subtracted from the time varying input signal v(t) fed to the input of the arrangement. The resulting signal u(t), obtained by subtracting the fed back signal from the input v(t) signal, is in turn fed to the input of the nonlinear amplifier.

The configuration depicted in FIG. 2A shows a well-known feedback scheme but reduces the transfer function of the nonlinear amplifier to a series of coefficients (e.g. the most significant coefficients) obtained by decomposing a response of the nonlinear amplifier into a power series (e.g. Taylor series) as suggested in the IEEE Transactions on Circuits and Systems II: Analog and Digital Signal Processing, Vol. 46, No. 3, March 1999, pp 315, entitled "Distortion in Elementary Transistor Circuits" and authored by Sansen, which is incorporated herein by reference in its entirety. According to this article, the relationship between input signal u(t) and output signal y(t) as represented in FIG. 2A can be expressed by the following power series expression:

$$y = a_0 + a_1 u + a_2 u^2 + a_3 u^3 + \quad (1)$$

wherein y=y(t) and u=u(t)

In expression (1), coefficient ($a_0$) represents a direct coupled (DC) component of the output signal (y), ($a_1$) represents the linear gain of the amplifier and coefficients ($a_2$, $a_3$, . . .) represent the distortion of the amplifier. To be noted that coefficient ($a_0$) may be removed from the transfer function representing the amplifier of FIG. 2A as in most practical cases the output of the amplifier and the feedback path include coupling capacitors.

Figure 2B:
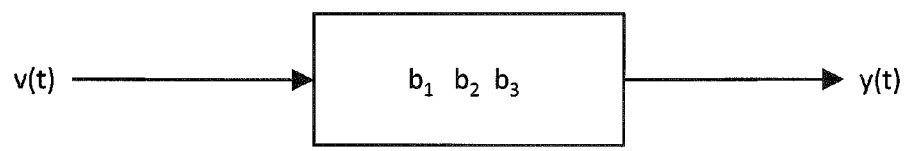
FIG. 2B shows an equivalent block diagram of the block diagram of FIG. 2A, wherein the negative feedback is replaced by modifying the characteristic power series coefficients of the non-linear amplifier.

As shown by the referenced article, the amplifier with the feedback configuration as represented in FIG. 2A can be represented by an equivalent open loop configuration containing a single amplifier as shown in FIG. 2B, wherein the equivalent power series coefficients ($b_1$, $b_2$, $b_3$) of the single amplifier are function of ($a_1$, $a_2$, $a_3$) and the feedback transfer function ($f$). According to the same article, these coefficients can be represented by the following expressions:

$$b_1 = \frac{a_1}{1+T} \quad (2)$$

$$b_2 = \frac{a_2}{(1+T)^3} \quad (3)$$

$$b_3 = \frac{a_3(1+T) - 2fa_2^2}{(1+T)^5} \quad (4)$$

wherein
$T = fa_1$

It is clear from expression (2) that the linear gain of the feedback configuration represented by the coefficient ($b_1$) is reduced by a factor $(1+T)^{-1}$, whereas distortion coefficients ($b_2$, $b_3$, . . .) are also reduced. This means that feedback reduces gain of the amplifier (e.g. reduces an output voltage amplitude) but also increases linearity by reducing signal distortion. The person skilled in the art thus uses feedback around an amplifier to reduce distortion of a signal when passing through the amplifier at the expense of gain of the amplifier.

Expressions (2)-(4) allow to streamline (e.g. for varying values of the feedback transfer function $f$) the calculation of a measure of distortion of the nonlinear amplifier, such as the second order intercept point (IP2) and the third order intercept point (IP3), which the skilled person is well aware of. In the referenced article, Sansen has generated expressions corresponding to the distortion as function of the feedback transfer function ($f$), an input voltage amplitude (V) and the various amplifier coefficients ($a_1$, $a_2$, $a_3$).

According to the same article, feedback improves the input IP3 (IIP3) by close to $30*\log_{10}(1+T)$ dB and improves the output IP3 (OIP3) by close to $10*\log_{10}(1+T)$ dB, where (T) is the loop gain and defined by $T=f*a_1$. This method of calculating IP3 was used to quantify the improvements in a feedback configuration obtained according to the various embodiments of the present disclosure.

As previously mentioned, in the case of RF amplifiers, feedback (e.g. using an impedance within a feedback path) is a method of choice for reducing signal distortion, where it is assumed that a feedback component within the feedback path follows a linear response, such as to not introduce any additional nonlinearity into the amplifier. Therefore it is desirable that the feedback path has a linear response over the operating frequency range and signal amplitude range. Furthermore, the push for higher integration and support of multiple wideband frequency applications within a same IC, such as, for example, 60 GHz/5G Wi-Fi, cellular standards (GSM/EDGE/

3G/4G), Wi-Fi/BT/GPS/FM/Cellular may require a flexibility to modify the feedback used in the amplifier to tailor its response to the requirements imposed by the application (e.g. different modulation schemes). As such, a feedback component within the feedback path may need to be variable, such that a corresponding impedance can be modified and consequently modify the amplifier's response to match the application's signal properties.

In the case where the variable feedback, such as a variable impedance, is to be integrated monolithically, the linearity requirement for the feedback path over a large frequency range and large signal swings at the output of the amplifier may become a challenging task. This is a known issue for the person skilled in the art of IC and RF design.

Teachings according to the prior art use field-effect transistor (FET) switches to implement such variable impedances. It is known in the art that such switches have a limited linear signal range (e.g. breakdown voltage) and linear performance (e.g. distortion as measured by low IP3 and low IP2 values). Therefore, when used in controlling a feedback impedance around an amplifier with a large output signal, the switch's limited linear signal range and linear performance can affect the linearity of the feedback path and thus affect the overall amplifier's linearity by limiting the amplifier's linearity to the linearity characteristics of the feedback impedance.

It follows that according to an embodiment of the present disclosure, and as described in the following paragraphs, a limiting effect on the overall linearity of an amplifier using a variable impedance feedback is reduced by using stacked switches in the variable impedance.

Figure 3:
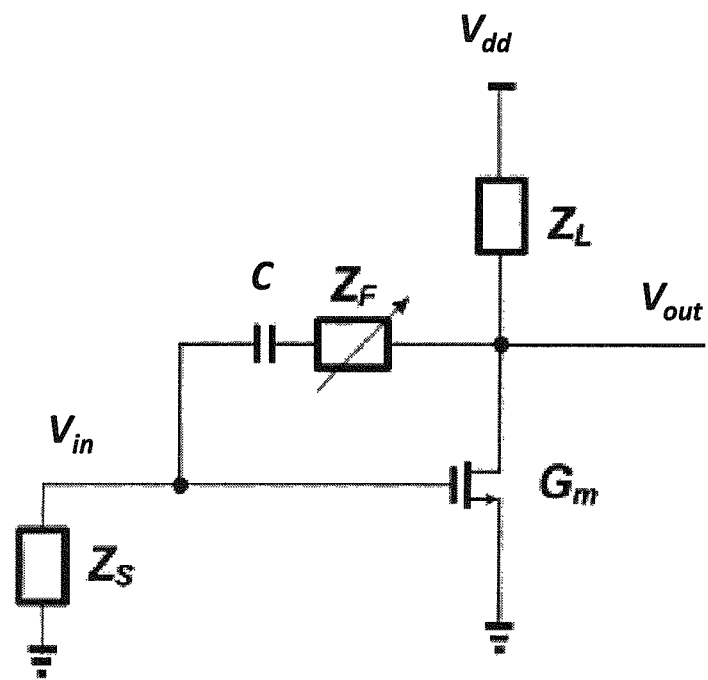
FIG. 3 shows an exemplary embodiment according to the present disclosure of an amplifier with variable feedback impedance used in a feedback path.

An RF amplifier arrangement with a variable feedback impedance is presented in FIG. 3. In the exemplary embodiment of FIG. 3, an RF amplifier, represented by a transistor with a transconductance gain ($G_m$), is connected to a first terminal of a load ($Z_L$) at the drain of the transistor ($G_m$), the load ($Z_L$) being connected to a power supply ($V_{dd}$) through a second terminal. An input signal, represented by its source impedance ($Z_S$), is connected to an input gate of the transistor ($G_m$). The feedback path between the drain and the gate of the transistor ($G_m$) comprises a variable feedback impedance ($Z_F$) in series with a coupling capacitor (C). The coupling capacitor (C) removes any DC component at the drain of the transistor prior to feeding a feedback signal to the input of the transistor ($G_m$). The source of the transistor is connected to a reference potential (e.g. ground).

In the embodiment shown in FIG. 3, an input RF signal fed to the gate of the transistor ($G_m$) is amplified and output at the ($V_{out}$) terminal connected to the drain of the transistor. The variable feedback impedance can be used to modify the response of the amplifier arrangement according to a desired frequency of operation and/or a desired output voltage amplitude range. In one embodiment according to the present disclosure, a controlling element (not shown), such as a transceiver used in a hand held cellular phone, which knows of the desired operating parameters of the amplifier, may control an impedance value of the variable impedance ($Z_F$).

Figure 4:
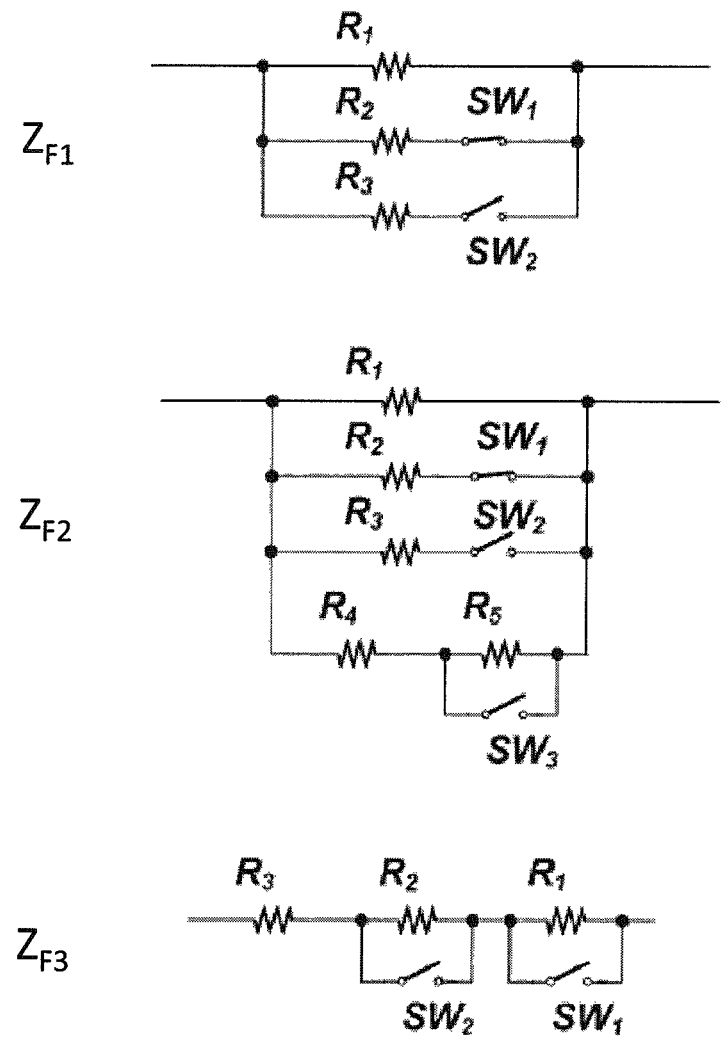
FIG. 4 shows exemplary embodiments according to the present disclosure of the variable feedback impedance of FIG. 3.

According to an embodiment of the present disclosure, the variable feedback impedance ($Z_F$) may comprise a plurality of switches to select an impedance value of ($Z_F$). FIG. 4 depicts various exemplary cases of such an embodiment, wherein the impedance ($Z_F$) is selected through a combination of switches. The variable feedback impedance ($Z_{F1}$) of the embodiment of FIG. 4, comprises three parallel impedances, a first parallel impedance comprising a resistor ($R_1$), a second parallel impedance comprising a resistor ($R_2$) in series with a switch ($SW_1$), and a third parallel impedance comprising a resistor ($R_3$) in series with a switch ($SW_2$). Depending on the ON or OFF state of the switches ($SW_1$, $SW_2$), the variable feedback impedance ($Z_{F1}$) of FIG. 4 can take 4 (=$2^2$, two to the power of the number of switches) different impedance values, ranging from a high impedance value corresponding to the value of ($R_1$) for the case where ($SW_1$, $SW_2$)= (OFF, OFF), to a low impedance value corresponding to the value of ($R_1$//$R_2$//$R_3$) for the case where ($SW_1$, $SW_2$)= (ON, ON). When a switch ($SW_1$, $SW_2$) is in the ON state, a current can flow through an associated path comprising an impedance ($R_1$, $R_2$), and when the switch is in the OFF state, the current does not flow through the associated path, effectively isolating the path and associated impedance from the other paths.

In yet another exemplary embodiment according to the present disclosure, a variable feedback impedance ($Z_{F2}$), shown in FIG. 4, adds a fourth parallel impedance to the exemplary case of ($Z_{F1}$). The fourth parallel impedance further comprises two resistors ($R_4$, $R_5$) connected in series and a switch ($SW_3$) connected in parallel with the resistor ($R_5$). The switch allows selection of the impedance of the fourth path between two different values (e.g. $R_4$ or $R_4$+$R_5$).

In yet another exemplary embodiment according to the present disclosure, a variable feedback impedance ($Z_{F3}$) is presented in FIG. 4. The variable impedance ($Z_{F3}$) comprises a plurality of series connected resistors (e.g. $R_1$, $R_2$, $R_3$) and one or more switches (e.g. $SW_1$, $SW_2$) connected in parallel to one or more of the series connected resistors. The switches allow insertion or removal (e.g. bypass) of a resistor to/from the impedance ($Z_{F3}$).

Although the exemplary embodiments of FIG. 4 show a specific number of resistors, switches and impedance paths, the skilled person will be able to extend these teachings to derive other impedances using a number of resistors, capacitor, inductors and switches connected in either series or parallel connections. The variable impedances according to the various embodiments of the present disclosure may be realized using any reactive or resistive component, as the exemplary usage of resistive component in the various figures of the present disclosure should not be viewed as limiting the scope of the concept as disclosed herein but rather as examples of its inventive concept. Furthermore, such impedances may be realized either with lumped elements, such as the discrete components depicted in the various figures of the present disclosure, or distributed elements. In the case of distributed elements, resistance, capacitance and inductance of varying values may be realized using for example transmission line elements such as half-wavelength, quarter-wavelength, series and parallel stubs, and resonant stubs.

In some cases and as described in previous paragraphs of the present disclosure, using switches (e.g. FET switches) in the feedback path, such as for the case of the variable feedback impedances shown in FIG. 4, may negatively impact the overall response of the amplifier arrangement (e.g. FIG. 3). This is mainly due to the limitation of the switches, such as for example when implemented within an integrated circuit, when subjected to high frequency signals (e.g. RF) and high voltage swings. This limitation can result in degradation of the linearity of the amplifier arrangement, such as for example, as measured by IP2 and IP3, as well as the linear range of operation of the arrangement, as measured for example by the 1 dB compression point (P1dB) of the amplifier arrangement. The skilled person will require no more additional information on the importance of these parameters and methods for measuring them.

Figure 5:
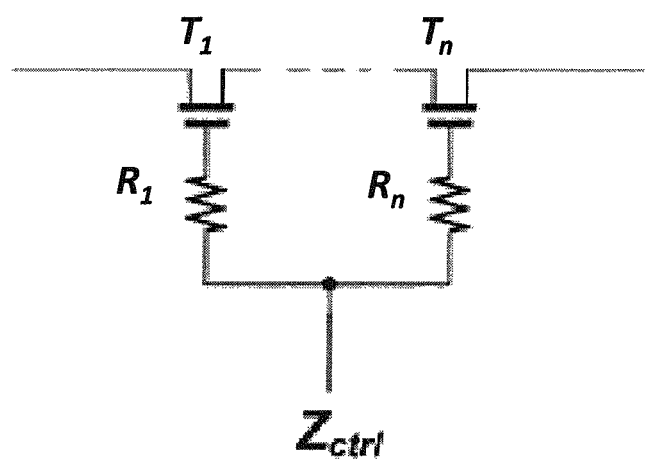
FIG. 5 shows an exemplary embodiment according to the present disclosure of a switch with stacked transistors.

In order to circumvent said switch limitations in the case where a switch is used within a feedback path of an RF amplifier, according to an embodiment of the present disclosure and as shown in FIG. 5, a switch comprising stacked transistors is used. In the switch embodiment of FIG. 5, a plurality of FET transistors ($T_1, \ldots, T_n$) are cascaded in a series arrangement with gates connected to a common enabling/disabling control signal (e.g. $Z_{ctrl}$) through a resistor ($R_1, \ldots, R_n$). A first voltage at the control signal ($Z_{cntrl}$) can turn transistors ($T_1, \ldots, T_n$) ON, causing a current to flow through a conduction path created between a drain and a source of the transistors. A second voltage at the control signal ($Z_{cntrl}$) can turn transistors ($T_1, \ldots, T_n$) OFF, thus preventing a current to flow through the transistors. As such, the arrangement shown in FIG. 5 can be used as a switch controlled by the signal ($Z_{ctrl}$).

The stacked switch arrangement as shown in FIG. 5 allows power handling capability greater than a power handling capability of a switch comprising a single transistor, because a voltage present across a single transistor switch (e.g. when the transistor switch is in an OFF state) may be sufficiently high to damage the one transistor, as opposed to dividing the voltage across the multiple transistors of the embodiment depicted in FIG. 5. More information about stacked transistors can be found, for example, in U.S. Pat. No. 7,248,120, issued on Jul. 24, 2007, entitled "Stacked Transistor Method and Apparatus", which is incorporated herein by reference in its entirety.

The stacked switch arrangement also provides a higher linearity (e.g. lower distortion) when combined with known design methods and improved process and integrated circuit design advancements. One such advancement comprises the so-called "HaRP™" technology enhancements developed by the assignee of the present application. The HaRP™ enhancements provide for new RF architectures and improved linearity in RF front end solutions. FETs made in accordance with the HaRP™ enhancements are described in pending applications and patents owned by the assignee of the present application. For example, FETs made in accordance with the HaRP™ enhancements are described in U.S. Pat. No. 7,910,993 B2, issued on Mar. 22, 2011, entitled "Method and Apparatus for Use in Improving Linearity of MOSFETs Using an Accumulated Charge Sink", and U.S. Pat. No. 8,129,787 B2, issued on Mar. 6, 2012, entitled "Method and Apparatus for Use in Improving Linearity of MOSFETs Using an Accumulated Charge Sink", both of which are incorporated herein by reference in their entirety.

More specifically, and as described in the aforementioned patents, FETs (e.g. FET switches) made in accordance with HaRP™ technology enhancements comprise accumulated charge control (ACC) silicon on insulator (SOI) metal-oxide-semiconductor field-effect transistors (MOSFETs), where each ACC SOI MOSFET includes an accumulated charge sink (ACS) coupled thereto which is used to remove accumulated charge from the ACC FET body when the FET (e.g. switch) operates in an accumulated charge regime. The ACS facilitates removal or otherwise controls the accumulated charge when the ACC SOI MOSFET operates in the accumulated charge regime. Thus, the HaRP™ technology enhancements provide a method and apparatus for use in improving linearity characteristics of MOSFET devices (e.g. switches) using the accumulated charge sink (ACS).

Via the ACS terminal, the HaRP™ FETs are adapted to remove, reduce, or otherwise control accumulated charge in SOI MOSFETs, thereby yielding improvements in FET performance characteristics. In one exemplary implementation, a variable feedback impedance (e.g. FIGS. 3 and 4) having at least one SOI MOSFET switch is configured to operate in an accumulated charge regime. The ACS is operatively coupled to the body of the SOI MOSFET, and eliminates, removes, or otherwise controls accumulated charge when the FET is operated in the accumulated charge regime, thereby reducing the nonlinearity of the parasitic off-state source-to-drain capacitance of the SOI MOSFET. In such an RF switch implemented with the improved SOI MOSFET devices, harmonic and intermodulation distortion can be reduced by removing or otherwise controlling the accumulated charge when the SOI MOSFET operates in an accumulated charge regime. In some other exemplary embodiments according to the present disclosure, all of the transistor switches ($T_1, \ldots T_n$) of FIG. 5 are implemented using the HaRP™ technology enhancement.

Figure 6:
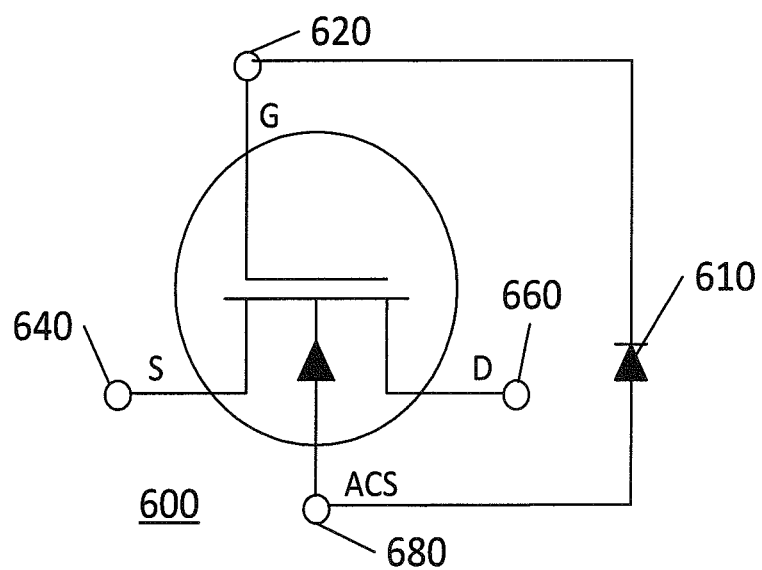
FIG. 6 is a simplified schematic of a transistor switch made in accordance with HaRP™ technology enhancements.

In some implementations as described in the aforementioned patents, the ACC MOSFET comprises a four terminal device, where an accumulated charge sink (ACS) terminal is coupled to a gate terminal via a diode. One such four terminal ACC MOSFET (600) is shown in FIG. 6. FIG. 6 is a simplified schematic of an SOI NMOSFET (600) which can be used in the stacked transistor switch of FIG. 5 and which is adapted to control accumulated charge, embodied as a four terminal device, where the ACC MOSFET (600) includes a gate terminal (620), source terminal (640), drain terminal (660), and accumulated charge sink (ACS) terminal (680).

As shown in the implementation of FIG. 6, the ACS terminal (680) is coupled to the gate terminal (620) via a diode (610). This implementation may be used to prevent a positive current flow into the body of the MOSFET (600) caused by a positive $V_G$-to-$V_S$ (or, equivalently, $V_{GS}$, where $V_{GS}=V_G-V_S$) bias voltage, as may occur, for example, when the ACC MOSFET (600) is biased into an ON-state condition. When biased in an OFF-state condition, the ACS terminal voltage $V_{ACS}$ comprises the gate voltage plus a voltage drop across the diode (610). At very low ACS terminal current levels, the voltage drop across the diode (610) typically also is very low (e.g., <<500 mV, for example, for a typical threshold diode). The voltage drop across the diode (610) may be reduced to approximately zero by using other diodes, such as a 0 Vf (forward voltage) diode, for example. In one implementation, reducing the voltage drop across the diode is achieved by increasing the diode (610) width at fabrication. Additionally, maintaining the ACS-to-source or ACS-to-drain voltage (whichever bias voltage of the two bias voltages is lower) increasingly negative can also improve the linearity of the ACC MOSFET device (600).

As mentioned in the previous paragraph, the switch embodiment according to the present disclosure of FIG. 5 has the advantage of providing increased linearity when fabricated using HaRP™ technology advancements and increased linear range (e.g. power handling capability) by virtue of the cascaded transistors configuration, when compared to other type of switches, including FET switches fabricated by conventional processes, used in the art. When used in the variable feedback impedance ($Z_F$) (e.g. FIG. 4) of the embodiment of FIG. 3, the switch shown in FIG. 5 fabricated using HaRP™ technology advancements does not introduce any additional nonlinearity (e.g. as measured by IP2 and IP3), nor does it limit the linear response range (e.g. as measured for example by the P1dB) of the amplifier arrangement with variable feedback. Therefore and according to a further embodiment of the present disclosure an RF amplifier arrangement (e.g. FIG. 3) with a variable feedback impedance is presented, wherein the variable feedback impedance does not affect the linearity and does not affect the linear range of the amplifier arrangement.

The skilled person will know that the amplifier arrangement presented in FIG. 3 is one possible representation (e.g. conceptual) of an amplifier with a variable feedback impedance, and thus will know how to extend the teachings according to the various embodiments of the present disclosure to more specific cases and as required by some design parameters. FIGS.

Figure 7:
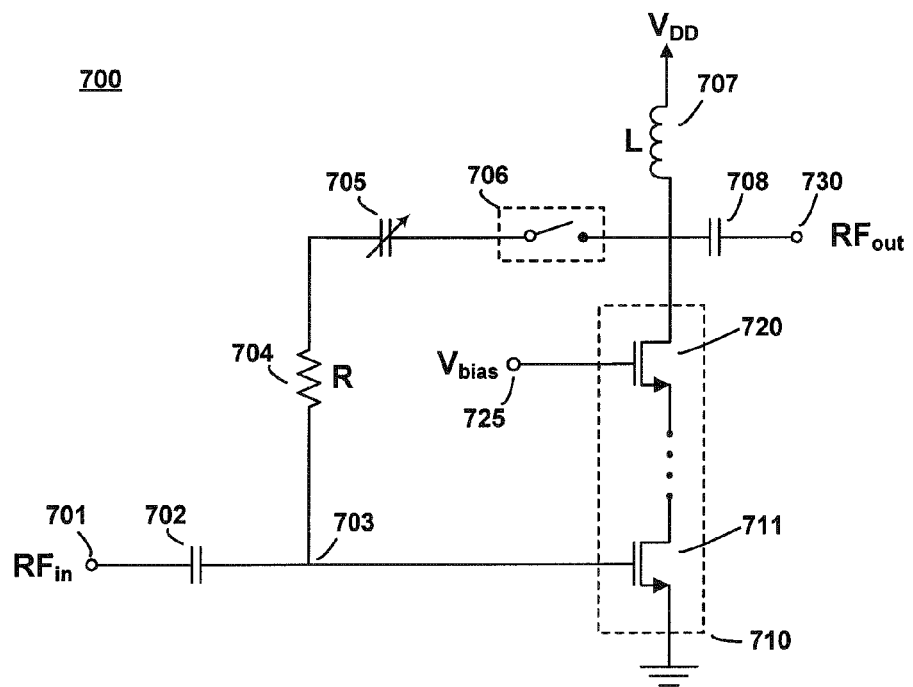
FIGS. 7 and 8 show exemplary embodiments according to the present disclosure of an amplifier with variable feedback impedance used in a feedback path.

FIG. 7 shows an exemplary embodiment according to the present disclosure of an RF amplifier arrangement (700) which comprises a variable feedback impedance in a feedback path. In the exemplary embodiment depicted by FIG. 7, an RF input signal ($RF_{in}$) is fed to an input terminal (701) of the amplifier arrangement, which connects to a gate of an input transistor (711) of an amplifier (710) through a decoupling capacitor (702). The amplifier (710) comprises a stacked arrangement of transistors (711, ..., 720) to create a cascode configuration, known to the person skilled in the art. In this configuration, the first input transistor (711) provides a high input impedance to the input signal ($RF_{in}$), while the remainder transistors (..., 720) provide a gain stage for the amplifier. A drain of an output transistor (720) of the amplifier (710) is connected to a power supply ($V_{dd}$) through an RF choke (707). At the same time, an output signal ($RF_{out}$) at an output terminal (730) of the amplifier arrangement (700) is provided through the drain of the output transistor (720) and through a decoupling (e.g. DC blocking) capacitor (708). More information on amplifiers using stacked transistors can be found, for example, in U.S. Pat. No. US2011/0181360A1, published on Jul. 28, 2011, which is incorporated herein by reference in its entirety.

In the exemplary embodiment of FIG. 7, a feedback path is provided between the output of the amplifier (710) (e.g. drain of the output transistor (720)) and the input of the amplifier (e.g. gate of the input transistor (711) at a node (703)). The variable feedback path of the embodiment depicted in FIG. 7 comprises a switch (706), a variable capacitor (705) and a resistor (704). According to an exemplary embodiment of the present disclosure, the switch (706) can be a stacked transistor switch as described in reference to FIG. 5. According to a further embodiment of the present disclosure, the switch can be a stacked switch fabricated according to the HaRP™ technology process. In the embodiment of FIG. 7, when in the ON position (e.g. closed), the switch (706) can activate the feedback path around the input/output of the amplifier (710) and consequently the amplifier (710) operates in closed loop. Alternatively, when in the OFF position (e.g. open), the switch can deactivate the feedback path around the amplifier and thus the amplifier (710) operates in open loop. At this point and in reference to the various disclosures of the present application, the skilled person would recognize the advantages of using a stacked transistor switch (e.g. (706)) in the embodiment of the FIG. 7. Furthermore, the configuration of FIG. 7 allows for the flexibility to operate the amplifier (710) in open loop, or in closed loop with varying feedback impedance values as determined by the combination of the variable capacitor (705) and the resistor (704).

Furthermore, according to an embodiment of the present disclosure, the variable capacitor (705) can be a digitally tunable capacitor (DTC), with added benefits as described for example in International Application No. PCT/US2009/001358, entitled "Method and Apparatus for Use in Digitally Tuning a Capacitor in an Integrated Circuit Device," filed on Mar. 2, 2009, and in U.S. patent application Ser. No. 13/595,893 entitled "Method and Apparatus for Use in Tuning Reactance in an Integrated Circuit Device", filed on Aug. 27, 2012, both incorporated herein by reference in their entirety. Combining a DTC (705) and a stacked switch arrangement (706) fabricated using HaRP™ technology in the embodiment of FIG. 7 provides a circuital arrangement (700) with higher linear linearity (e.g. lower distortion) and higher linear range (e.g. higher output power linearity) than a similar implementation using traditional FET switch and traditional variable capacitors. According to some embodiments of the present disclosure, the feedback path of FIG. 7 can comprise a digitally tunable inductor (DTL) with added benefits as described in afore mentioned U.S. patent application Ser. No. 13/595,893.

Figure 8:
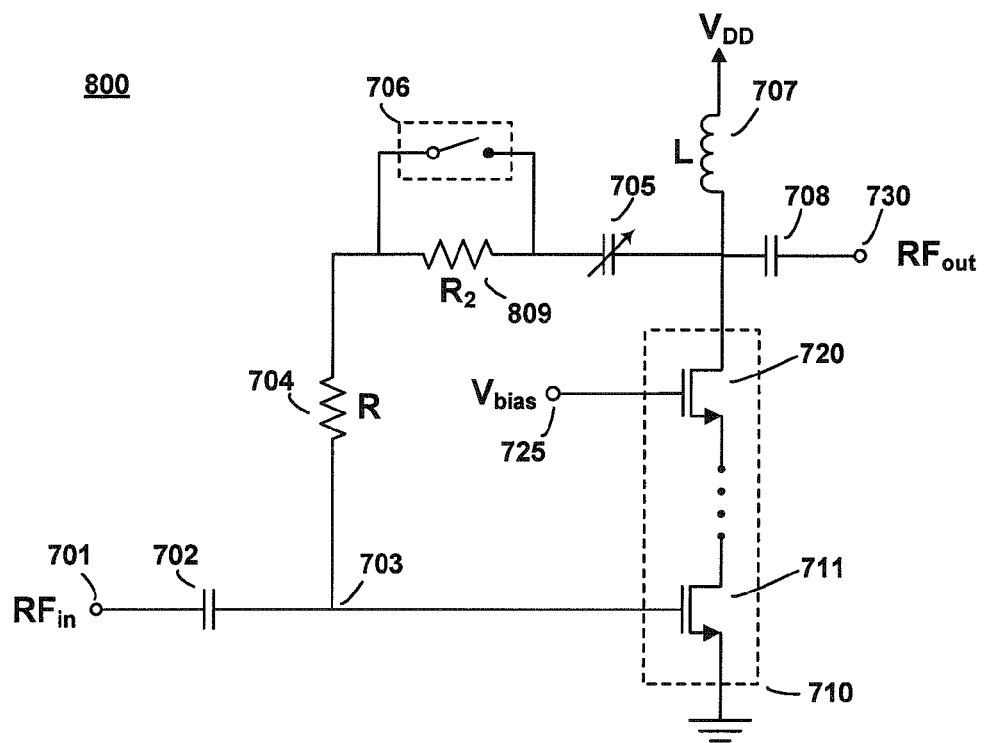

According to yet another exemplary embodiment of the present disclosure, FIG. 8 shows an amplifier arrangement (800) which comprises a variable feedback impedance in a feedback path. The arrangement depicted in the FIG. 8 is the same as one depicted in FIG. 7 except for the feedback path. In the exemplary embodiment shown in FIG. 8, the feedback path comprises a variable capacitor (705) in series connection with a fixed resistor (704) and a variable (e.g. selectable) resistor (809). In this exemplary embodiment, the variable resistor comprises a fixed resistor ($R_2$) in parallel with a switch (706). The skilled person will recognize that the switch (706) can either remove the resistor ($R_2$) from the feedback path, or include the resistor ($R_2$) in the feedback path. As a consequence, the feedback impedance can be the series combination of the variable capacitor (705) with resistor (704), or the series combination of the capacitor (705) with both resistors (704, 809). As previously mentioned, use of a stacked transistor switch and DTC in the embodiment of FIG. 8 can result in performance benefits that the skilled person would appreciate. Further benefits in reducing distortion of the amplifier arrangement of FIG. 8 can be obtained by fabricating the stacked transistor switch using the HaRP™ technology advancements.

Although FETs (e.g. MOSFETs) are used to describe the stacked transistor switch embodiment in the present disclosure, a person skilled in the art would recognize that either P-type or N-type MOSFETs may be used. The skilled person would also recognize that other types of transistors such as, for example, bipolar junction transistors (BJTs) can be used instead or in combination with the N-type or P-type MOSFETs. Furthermore, a person skilled in the art will also appreciate the advantage of stacking more than two transistors, such as three, four, five or more, provide on the voltage handling performance of the switch. This can for example be achieved when using non bulk-Silicon technology, such as insulated Silicon on Sapphire (SOS) technology and silicon on insulated (SOI) technology. In general, individual devices in the amplifier arrangement of FIG. 3 can be constructed using CMOS, silicon germanium (SiGe), gallium arsenide (GaAs), gallium nitride (GaN), bipolar transistors, or any other viable semiconductor technology and architecture known. Additionally, different device sizes and types can be used within the stacked transistors of the various switches such as to accommodate various current handling capabilities of the switches.

According to further embodiments of the present disclosure, monolithic integration of any of the presented arrangements using a process such as CMOS, CMOS SOI, or CMOS SOS is provided. Benefits of SOI and SOS processes include lower parasitic capacitance and thus higher linearity for stacked switches and transistors implemented using such processes, as well as high transistor stack capability (e.g. 3, 4 or greater) and higher breakdown voltages for larger voltage swings. Additional benefits of the SOI and SOS processes are lack of p-n junction diode which allows for better output linearity over a wider output signal range. Although in some embodiment full monolithic integration is performed, according to further embodiments of the present disclosure, partial monolithic integration may be performed, wherein for example some components of the various arrangements disclosed are not monolithically integrated. The skilled person can envision multitude ways of partitioning the arrangements according to the present embodiments for integration purposes and as fit by certain desired design criteria, while keeping the benefits of the presented embodiments.

Therefore, in accordance with the present disclosure, amplifier arrangements with variable feedback impedance is provided, which allow maintaining a higher linearity (lower distortion) and higher output linear range due to the non-limiting characteristics of the variable components used in the impedance path. Methods for fabrication and structures for said variable components are also provided.

The person skilled in the art will be able to extend the teachings of the present disclosure to any type of amplifier (e.g. RF) circuitry requiring a variable, tunable and/or switchable feedback impedance in a manner similar to what has already been discussed in the present disclosure. While the devices and methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

The invention claimed is:

1. A radio frequency (RF) amplifier arrangement comprising:
    an RF amplifier;
    an input terminal of the RF amplifier arrangement connected to an input of the RF amplifier;
    an output terminal of the RF amplifier arrangement connected to an output of the RF amplifier;
    a feedback path connected between the output terminal and the input terminal, the feedback path comprising:
        i) a selectable impedance network comprising:
            one or more resistive and/or reactive components; and
            one or more stacked transistor switches operatively coupled to the one or more resistive and/or reactive components; and
        ii) a capacitor in series connection with the selectable impedance network,
        wherein:
            the one or more stacked transistor switches are configured to select an impedance value of the selectable impedance network from a plurality of selectable impedance values in correspondence of a desired impedance value of the feedback path.

2. The RF amplifier arrangement of claim 1 wherein a stacked transistor switch of the one or more stacked transistor switches comprises a plurality of field effect transistors (FETs) operatively coupled in a stacked arrangement.

3. The RF amplifier arrangement of claim 2 wherein a FET of the plurality of FETs is an accumulated charge control (ACC) silicon on insulator (SOI) metal-oxide-semiconductor field-effect transistor (MOSFET).

4. The RF amplifier arrangement according to any one of claims 1-3 wherein a stacked transistor switch of the one or more stacked transistor switches is configured to set the impedance value to a first impedance value when in an OFF state and to a second impedance value different from the first impedance value when in an ON state.

5. The RF amplifier arrangement according to any one of claims 1-3 wherein a stacked transistor switch of the one or more stacked transistor switches is configured to stop a current flow through the feedback path when in one state and to allow the current flow through the feedback path when in an alternate state.

6. The RF amplifier arrangement according to any one of claims 1-3 wherein a stacked transistor switch of the one or more stacked transistor switches is operatively coupled in parallel to a resistive and/or reactive component of the one or more resistive and/or reactive components such as to include or exclude an effect of the resistive and/or reactive component from the feedback path.

7. The RF amplifier arrangement according to any one of claims 1-3 wherein the feedback path further comprises a plurality of parallel feedback paths between the output terminal and the input terminal of the amplifier, each feedback path of the plurality of feedback paths comprising one or more resistive and/or reactive components.

8. The RF amplifier arrangement of claim 7 wherein a stacked transistor switch of the one or more stacked transistor switches is configured to allow a current flow through a feedback path of the plurality of feedback paths when in one state and to stop the current flow through the feedback path when in an alternate state.

9. The RF amplifier arrangement according to any one of claims 1-3 wherein the RF amplifier comprises an arrangement of stacked transistors.

10. The RF amplifier arrangement according to claim 9, wherein the arrangement of stacked transistors is configured as a cascode amplifier.

11. The RF amplifier arrangement according to any one of claims 1-3 wherein a reactive component of the one or more reactive components is a digitally tunable capacitor (DTC).

12. The RF amplifier arrangement according to any one of claims 1-3 wherein a reactive component of the one or more reactive components is a digitally tunable inductor (DTL).

13. The RF amplifier arrangement according to any one of claims 1-3 wherein the one or more stacked transistor switches are configured to select the impedance of the feedback path according to a desired frequency of operation of the RF amplifier arrangement.

14. The RF amplifier arrangement of claim 13 wherein the desired frequency of operation is in correspondence of a wideband frequency application.

15. The RF amplifier arrangement of claim 14 wherein the wideband frequency application comprises: a) 60 Ghz/5G Wi-Fi, b) GSM/EDGE/3G/4G, and c) Wi-Fi/BT/GPS/FM/Cellular.

16. A circuital arrangement comprising the RF amplifier arrangement according to any one of claims 1-3.

17. The RF amplifier arrangement according to any one of claims 1-3, the RF amplifier being monolithically integrated.

18. The RF amplifier arrangement of claim 17, fabricated entirely or partially using one of: a) silicon on insulator (SOI) technology, and b) silicon on sapphire (SOS) technology.

19. A method for reducing the effect of a variable impedance in a feedback path of a radio frequency (RF) amplifier, the method comprising:

providing an RF amplifier with a characteristic output voltage range;
providing one or more resistive and/or reactive components;
providing one or more stacked transistor switches;
operatively connecting the one or more components and the one or more stacked transistor switches;
based on the connecting, obtaining a variable impedance with an impedance value of the variable impedance selectable via the one or more stacked transistor switches;
operatively coupling the variable impedance between an output terminal of the RF amplifier and an input terminal of the RF amplifier;
based on the coupling, creating a feedback path comprising the variable impedance and a series connected capacitor around the RF amplifier;
based on the creating, selecting the impedance value of the variable impedance based on a characteristics of an input RF signal;
based on the selecting, operating the RF amplifier in a feedback mode with the selected impedance value of the feedback path; and
based on the operating, maintaining the characteristic output voltage range of the RF amplifier.

20. The method of claim 19 wherein the stacked transistor switches comprise a plurality of field-effect transistors (FETs) and wherein a transistor of the plurality of FETs is an accumulated charge control (ACC) silicon on insulator (SOI) metal-oxide-semiconductor field-effect transistor (MOSFET).

21. The method of claim 20 wherein a characteristic response of the RF amplifier with the feedback path for a selected impedance value of the variable impedance is not limited by a characteristic of a stacked transistor switch of the one or more stacked transistor switches.

22. The method of claim 21 wherein the characteristic response of the RF amplifier with the feedback path comprises: a) a linear signal range, b) a linear performance, c) a distortion, and d) an output voltage range.

* * * * *